US010528009B2

(12) United States Patent
Wiezell

(10) Patent No.: US 10,528,009 B2
(45) Date of Patent: Jan. 7, 2020

(54) PHASE COMPENSATED PLL

(71) Applicant: Sequans Communications S.A., Colombes (FR)

(72) Inventor: Martin Wiezell, Colombes (FR)

(73) Assignee: SEQUANS COMMUNICATIONS S.A., Colombes (FR)

( * ) Notice: Subject to any disclaimer, the term of this patent is extended or adjusted under 35 U.S.C. 154(b) by 0 days.

(21) Appl. No.: 15/988,838

(22) Filed: May 24, 2018

(65) Prior Publication Data

US 2018/0341230 A1 Nov. 29, 2018

(30) Foreign Application Priority Data

May 26, 2017 (EP) .................................... 17305618

(51) Int. Cl.
*G04F 10/00* (2006.01)
*H03L 7/085* (2006.01)
*H03L 7/099* (2006.01)

(52) U.S. Cl.
CPC ............ *G04F 10/005* (2013.01); *H03L 7/085* (2013.01); *H03L 7/0991* (2013.01)

(58) Field of Classification Search
CPC ... G04F 10/005; H03L 7/0991; H03L 7/0802; H03L 7/085; H03L 7/1976
USPC .......................................................... 341/166
See application file for complete search history.

(56) References Cited

U.S. PATENT DOCUMENTS

| | | | | |
|---|---|---|---|---|
| 5,576,664 A | * | 11/1996 | Herold | .................... H03L 7/091 331/1 A |
| 8,031,007 B2 | * | 10/2011 | Chang | ..................... H03L 7/085 331/1 A |
| 8,593,189 B1 | * | 11/2013 | Yen | ......................... H03L 7/085 327/147 |
| 8,947,139 B1 | | 2/2015 | Vercesi et al. | |
| 9,838,026 B2 | * | 12/2017 | Van Brunt | ............. H03L 7/091 |

OTHER PUBLICATIONS

Elkholy, A., et al., "A 3.7 mW Low-Noise Wide-Bandwidth 45 GHz Digital Fractional-N PLL Using Time Aplifier-Based TDC," IEEE Journal of Solid-State Circuits, 50(4) 867-881 (2015).
Levantino, S., et al., "Non Linearity Cancellation in Digital PLLs," Proceedings of the IEEE 2013 Custom Integrated Circuits Conference, IEEE, pp. 1-8 (2013).
Levantino, S., et al., "Bang-bang Digital PLLs," 42nd Solid State Circuits Conference, IEEE, pp. 329-334 (2016).

* cited by examiner

*Primary Examiner* — Brian K Young
(74) *Attorney, Agent, or Firm* — Hamilton, Brook, Smith & Reynolds, P.C.

(57) ABSTRACT

A phase locked loop comprising a time to digital converter and a fractional-n feedback loop, the PLL being configurable by a phase compensator module to reduce the dynamic range of the TDC required to maintain PLL performance.

22 Claims, 5 Drawing Sheets

PHASE COMPENSATED PLL

RELATED APPLICATION

This application claims priority under 35 U.S.C. § 119 or 365 to European, Application No. 17305618.5, filed May 26, 2017. The entire teachings of the above application are incorporated herein by reference.

TECHNICAL FIELD

This invention relates to configuration of a phase-locked loop (PLL) to reduce the current requirements of a time to digital converter (TDC) of the PLL while maintaining PLL performance, achieved by configuring the PLL to reduce the required dynamic range of the TDC. It is particularly suitable for fractional-n PLLs residing in telecommunication systems.

BACKGROUND

Miniaturisation of technology is a continuing trend, especially in telecommunication systems. The ubiquitous analogue PLL is being replaced by All-digital PLLs (ADPLLs) and digital intensive PLLs where a degree of analogue circuitry remains. This is because these newer systems require a smaller area (PCB real-estate advantages), lower power consumption and increased scalability.

However, there remain problems to be solved before the analogue PLL can be entirely replaced, such as phase noise and spurious content as would be understood. At the current time, a traditional analogue PLL based on a charge pump (CP) and a loop filter (LPF) will still have better (less) phase noise and spurious content than its digital variant.

However, the CP requires lot of design effort since it usually dominates the in-band noise and may also contribute to spurious content. Additionally, the LPF is usually very large, and is often positioned outside the IC in question. There is a strong drive towards making the CP and LPF more digital intensive to reduce size, lower power consumption and improve noise response.

As shown in FIG. 1, a known integer-N ADPLL 10 (and also applying to a digital intensive PLL), comprises a phase frequency detector (PFD) 12 coupled to a a Time-To-Digital converter (TDC) 13 (which typically replaces the CP of a traditional analogue PLL). The TDC may comprise a Vernier topology comprising a plurality of steps (D-type latches) or any other suitable topology as would be understood. The TDC is coupled to a digital loop filter (LPF) 14 (which typically replaces the analogue LPF of a traditional analogue PLL), the LPF is coupled to a Digital Controlled Oscillator (DCO) 15 (which typically replaces the Voltage Controlled Oscillator (VCO) of a traditional analogue PLL). The PLL 10 also comprises a feedback loop 18 between the DCO 15 and the PFD 12 comprising a divider module 16 capable of dividing an input signal by an integer N. Operation of these components is known to the skilled person and so is not described herein.

As would be understood, in operation, PFD 12 is fed by a reference signal 11 having a frequency $f_R$ and a divided signal 17, the divided signal 17 being the result of the divider module 16 acting on DCO output 19. In operation, PLL 10 outputs DCO output 19 having frequency, $f_V = f_R \times N$.

In an ADPLL 10, typically, the phase noise and spurious content are dominated by the TDC 13 performance due to its quantization nature. A better phase noise is achieved by a higher TDC resolution (as it is able to detect a smaller phase shift between its two inputs (11 and 17) from the PFD as would be understood).

The phase noise (PN) is calculated from:

$$PN = \frac{(2\pi)^2}{12} \frac{f_V^2}{f_R} \Delta t_{res}^2 \qquad (1)$$

Where $f_V$ is the DCO frequency (of DCO output 19), $f_R$ the reference frequency (of reference signal 11) and $\Delta t_{res}$ the TDC resolution. For example, to achieve a PN of −100 dBc with $f_V$=3 GHz and $f_R$=26 MHz, a TDC resolution of $\Delta t_{res}$=9 ps is required, which means a TDC dynamic range of almost 40 steps (actually 37) to cover a full DCO period as would be understood.

FIG. 2 shows a fractional-N PLL 20. Features labelled with the same reference numerals as FIG. 1 are not described again. The divider module 166 can divide by a number of differing integer values (N+$n_k$) and in effect, over a defined time period the divider module divides by an average value of (N+$n_{avg}$).

Notation N.n for divider 166 in the figures=N+n as would be understood where n=$n_{avg}$, the average value of $n_k$.

The $n_k$ component of the integer values used may be provided by a sigma delta module (ΣΔ) 21. Module 21 that provides integer values $n_k$ may be any sequence generator where the average value of the sequence converges towards n which is a necessary condition for PLL locking at the desired frequency. The ΣΔ continuously changes the division factor of divider module 166 to provide the effective average value of n to generate a phase and frequency lock as would be understood. In operation, PLL 20 outputs DCO output 19 having frequency, $f_V = f_R \times N+n$, where n is the average value of $n_k$.

As is known, in order to obtain low fractional noise content, a higher-order ΣΔ is used to shift the noise outside of the bandwidth of the PLL in question (noise shaping). As the differing integer values used by the divider module 166 can place the divided signal 17 in different positions with respect to different periods of the DCO output 19, more than one DCO period needs to be covered by the TDC as would be understood. This results in a TDC with high dynamic range requirement when in a locked state resulting in high TDC current consumption, complexity and layout area, as the power and complexity scales at least linear with its dynamic range.

By way of example, the following table (table 1) shows both a low order ΣΔ input $n_k$ 22 (left hand side) and a high order input $n_k$ 22 (right hand side) to divider 166 in the fractional-N architecture of FIG. 2. In both cases the average value of n is 0.3 (as can be seen) and N of the divider module is initialised to 100. Over the 10 separate operations (at each clock cycle of reference signal 11) of the PLL, the output 24 from the TDC provides a digital signal proportional to the phase difference between reference signal 11 and divider signal 17 as detected by the PFD. As can be seen in this example, with a low order ΣΔ, TDC output 24 differs within two periods (−0.2 to 0.9) of DCO output 19. With a high order ΣΔ, TDC output 24 differs within (has a span of) eight periods (−2.2 to 3.7) of DCO output 19. Accordingly, with a high order ΣΔ (to reduce noise), the TDC requires a larger dynamic range to be able to cater for the full range of PFD outputs.

TABLE 1

| $n_k$ (22) | N_div (17) | TDC_OUT (24) | $n_k$ (22) | N_div (17) | TDC_OUT (24) |
|---|---|---|---|---|---|
| 0 | 100 | 0.3 | 0 | 100 | 0.3 |
| 0 | 100 | 0.6 | -3 | 97 | 3.6 |
| 0 | 100 | 0.9 | 1 | 101 | 2.9 |
| 1 | 101 | 0.2 | 3 | 103 | 0.2 |
| 0 | 100 | 0.5 | -1 | 99 | 1.5 |
| 1 | 101 | -0.2 | 4 | 104 | -2.2 |
| 0 | 100 | 0.1 | -3 | 97 | 1.1 |
| 0 | 100 | 0.4 | 1 | 101 | 0.4 |
| 0 | 100 | 0.7 | -3 | 97 | 3.7 |
| 1 | 101 | 0 | 4 | 104 | 0 |

There is therefore a need to reduce the requirements of the TDC (dynamic range) whilst maintaining PLL performance such as acceptable noise performance, low current consumption and acceptable resolution of the TDC.

SUMMARY

According to a first aspect there is provided a phase locked loop as defined in Claim 1 of the appended claims. Thus there is provided a phase locked loop, "PLL" comprising a time to digital converter, "TDC" and a fractional-n feedback loop, the PLL being configurable by a phase compensator module to reduce the dynamic range of the TDC required to maintain PLL performance.

Optionally, the PLL wherein the fractional-n feedback loop further comprises a configurable divider module, the divider module being configurable by a first output of the phase compensator to configure the PLL.

Optionally, the PLL wherein the phase compensator module comprises an input coupled to an output of a sigma delta module for noise shaping.

Optionally, the PLL wherein the phase compensator module further comprises a second output to be added to an output of the TDC.

Optionally, the PLL wherein the second output of the phase compensator module is arranged to boost the output of the TDC to that of a TDC without a reduced dynamic range such that sigma delta noise shaping of the PLL is maintained.

Optionally, the PLL wherein the phase compensator is arranged to provide on a first output to the divider module, a low sigma delta signal converted from a high sigma-delta signal input to the phase compensator, and to provide on a second output, a feedforward signal to boost the output of the TDC to levels typical of a high sigma delta input to the divider module.

Optionally, the PLL wherein the second output of the phase compensation module to be added to the output of the TDC is amplified by the phase compensation module or by a gain module.

Optionally, wherein the sigma delta module is arranged to provide high order sigma delta modulation at its output.

Optionally, wherein the PLL further comprises a phase frequency detector, "PFD", a loop filter, "LPF" and digital controlled oscillator, "DCO".

Optionally, wherein the PLL comprises an all-digital PLL or a digital intensive PLL.

According to a second aspect there is provided a method as defined in claim 11. Thus there is defined method of configuring a PLL according to any of claims 1 to 10, the method comprising using a phase compensator to reduce the dynamic range of a TDC of the PLL while maintaining PLL performance.

Optionally, the method further comprising the configuring the PLL by configuring a configurable divider module of the feedback loop with the phase compensator.

Optionally, the method further comprising the phase compensator module boosting an output of the TDC to that of a TDC without a reduced dynamic range such that sigma delta noise shaping of the PLL is maintained.

Optionally, the method further comprising providing on a first output of the phase compensator to the divider module, a low sigma delta signal converted from a high sigma-delta signal input to the phase compensator, and providing on a second output of the phase compensator, a feedforward signal to be added to the output of the TDC to boost the output of the TDC to levels typical of a high sigma delta input to the divider module.

Optionally, the method wherein the phase compensator module comprises an input coupled to an output of a sigma delta module for noise shaping.

Optionally, the method wherein the phase compensator module further comprises a second output to be added to an output of the TDC.

Optionally, the method wherein the second output of the phase compensation module to be added to the output of the TDC is amplified by the phase compensation module or by a gain module.

Optionally, the method wherein the sigma delta module is arranged to provide high order sigma delta modulation at its output.

Optionally, the method wherein the PLL further comprises a phase frequency detector, "PFD", a loop filter, "LPF" and digital controlled oscillator, "DCO".

Optionally, the method wherein the PLL comprises an all-digital PLL or a digital intensive PLL.

According to a third aspect there is provided a computer readable medium as defined in claim 15.

With all the aspects, preferable and optional features are defined in the dependent claims.

Throughout this description, the use of sigma-delta is interchangeable with delta-sigma.

BRIEF DESCRIPTION OF THE DRAWINGS

Embodiments will now be described, by way of example only, and with reference to the drawings in which.

In the figures, like elements are indicated by like reference numerals throughout.

OVERVIEW

Figure 2:
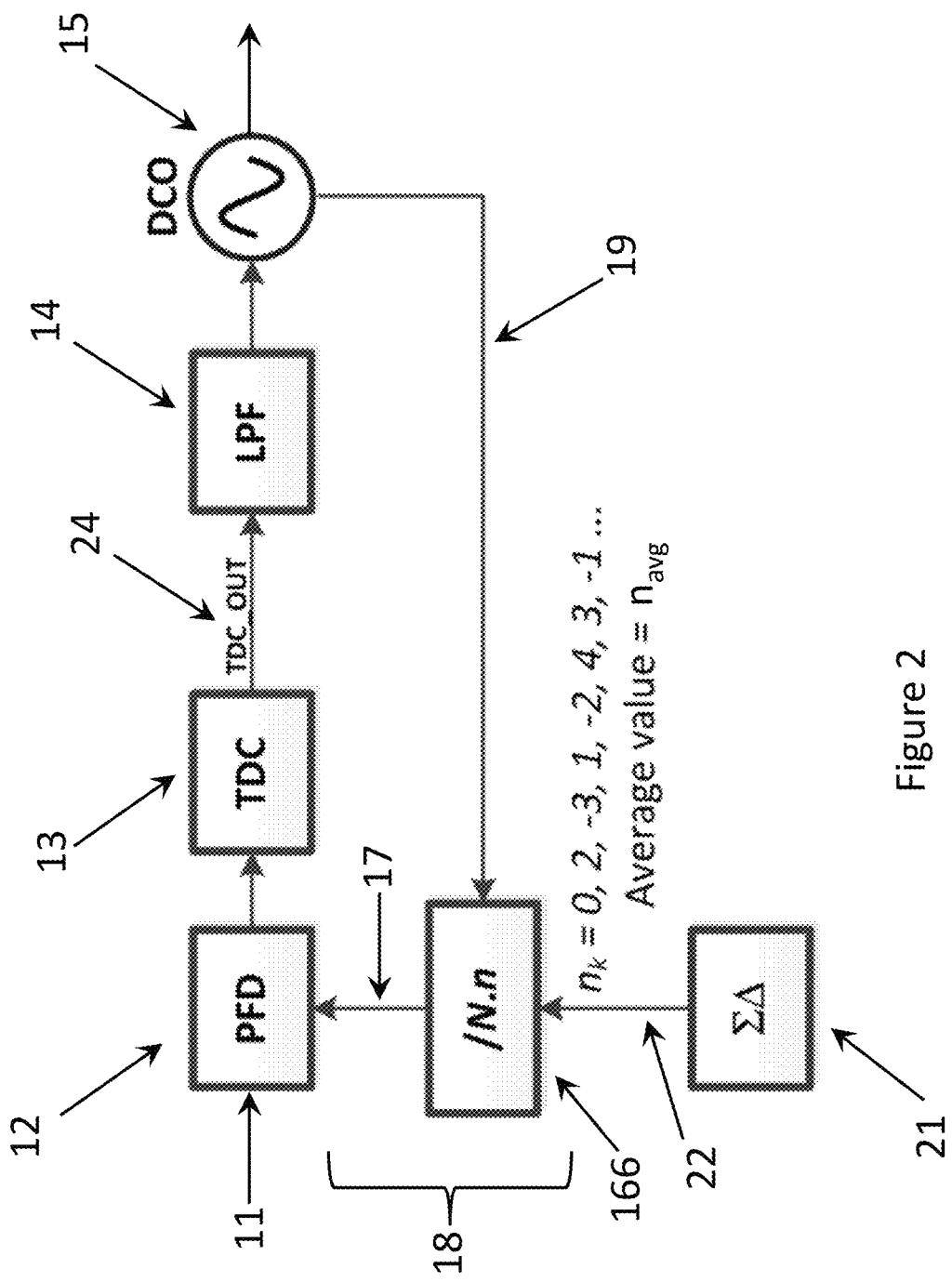
FIG. 2 illustrates a fractional N PLL architecture.

In overview, the architecture of a fractional-N PLL 20 (FIG. 2) is built-on to provide a modified architecture 30 (FIG. 3) being configurable and comprising a phase compensator 25. The phase compensator configures the PLL to reduce the dynamic range requirement of the TDC whilst maintaining PLL performance. The phase compensator is capable of modifying an output signal of the sigma delta module 166 such that the divider module of the PLL feedback loop 18 causes the TDC to operate as if it is being fed by a low order sigma delta (requiring a low TDC dynamic range) rather than a high order sigma delta (requiring a high TDC dynamic range). The phase compensator also feeds forward a signal to be added to the output of the TDC to boost the TDC output to the level that it would have been at if it was operating with a high dynamic range. Hence, performance of the PLL (in particular noise performance) is maintained while reducing the dynamic range requirement of the TDC.

This has benefits such as reduced current consumption of the TDC, reduced real-estate and a response comparable with high order sigma delta operation of the TDC with all the benefits of high-order such as quantisation noise moved up to higher frequencies.

DETAILED DESCRIPTION

Figure 3:
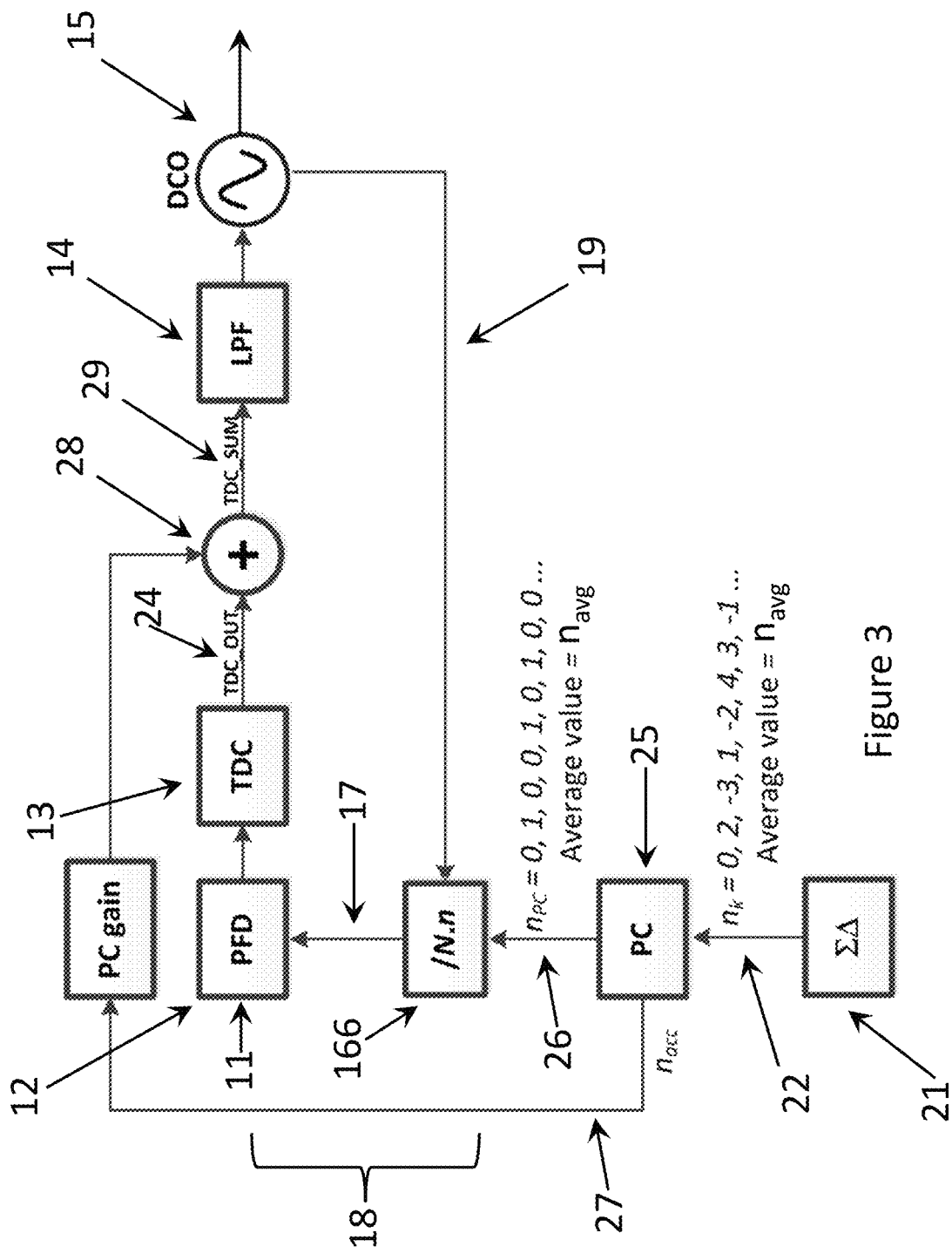
FIG. 3 illustrates a phase compensated fractional PLL architecture according to an embodiment.

Turning to FIG. 3, a phase compensated fractional PLL architecture 30 is shown according to an embodiment. In addition to the features of FIG. 2, the architecture of FIG. 3 comprises a phase compensator 25 comprising an input for altering the output of the sigma-delta module, $n_k$ (22) before providing the configurable divider module 166 of feedback loop 18 with altered input $n_{PC}$ (26) via a first phase compensator output.

The phase compensator may also comprise a second output for providing signal $n_{acc}$ (27) to an adder 28, the adder being arranged to add the $n_{acc}$ signal to the output from TDC, TDC_OUT (13) to provide new output, TDC_SUM (29) for filtering by LPF 14 as would be understood. In effect, adder 28 boosts the output of TDC, TDC_OUT (13). Signal $n_{acc}$ (27) from the phase compensator may be subject to a gain module 31 to balance with TDC_OUT (24) before being added by adder 28. The gain module which may comprise an amplifier may be discrete or may be comprised within the phase compensator 25.

Phase compensator 25 may be implemented in any form of appropriate digital device such as an FPGA, PLD or other programmable device or may be a software component.

Operation of phase compensator 25 will now be described to show that, despite the TDC 13 operating with a reduced dynamic range, (which usually would mean that a) a sync to all possibilities of phase difference when a high order sigma delta module 21 is used would not be possible and therefore b) low dynamic range would be used in known systems with a low order sigma delta which reduces noise performance of the PLL), the new system of FIG. 3 is capable of maintaining noise performance despite the TDF operating with a low dynamic range.

With reference to FIG. 3 the high-order ΣΔ generates a stream of numbers 22 where $n_k$, k=1, 2, 3, . . . with values between $n_{min}$ and $n_{max}$, so that:

$$n_{min} \leq n_k \leq n_{max} \quad (2)$$

For a first order ΣΔ, $n_{min}$=0 and $n_{max}$=1, and increases in magnitude as the ΣΔ order increases. In an embodiment the ΣΔ 21 is high-order for high fractional noise-suppression in the PLL 30, thus having $n_{min}$=−3 and $n_{max}$=+4.

The fractional division ratio $n_{avg}$ will be:

$$n_{avg} = \lim_{M \to \infty} \frac{\sum_{k=1}^{M} n_k}{M} \quad (3)$$

Phase compensator 25 uses an internal parameter $n_{internal}$ to generate $n_{PC}$ 26 and $n_{acc}$ 27 based on the sequence $n_k$ from ΣΔ 21 and the constant value $n_{avg}$ wherein $n_{avg}$, the long term average of $n_{PC}$ and $n_k$ are equal. The parameter $n_{PC}$ affects the TDC 13 performance by way of allowing the TDC to operate in a low sigma delta manner even though high sigma delta properties of operation of the PLL as a whole are obtained as will be described.

FIGS. 4A to 4D show four flowchart examples of how the phase compensator may be implemented using sigma-delta examples. Other implementations are available to meet the general concept of providing on a first output of the phase compensator to the divider module, a low sigma delta signal converted from a high sigma-delta signal input to the phase compensator, and to provide on a second output of the phase compensator, a feedforward signal to boost the output of the TDC to levels typical of a high sigma delta input to the divider module.

After every clock cycle of reference signal 11, the values of $n_{PC}$ and $n_{acc}$ are calculated by phase compensator 25. $n_{PC}$ 26 is then fed into the divider module 166 and $n_{acc}$ 27 is added (28) to the TDC output 24 to make TDC_SUM 29 after a gain adjustment.

Figure 4D:
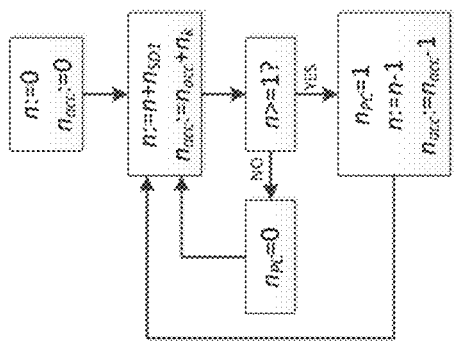
FIGS. 4A-4D illustrate various flowcharts for phase compensator implementation according to embodiments.
Figure 4C:
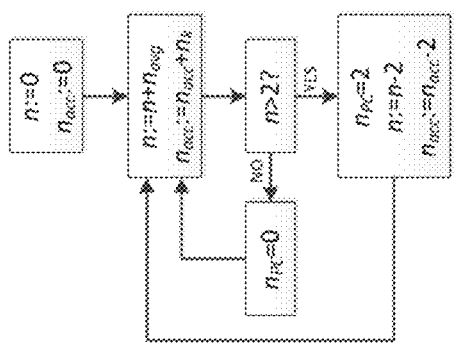
Figure 4B:
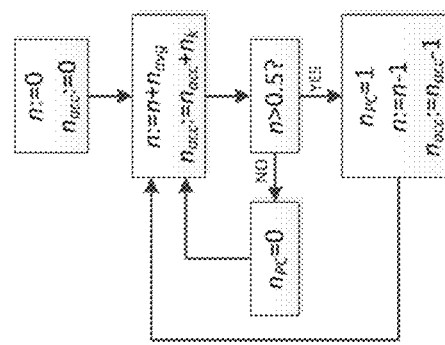
Figure 4A:
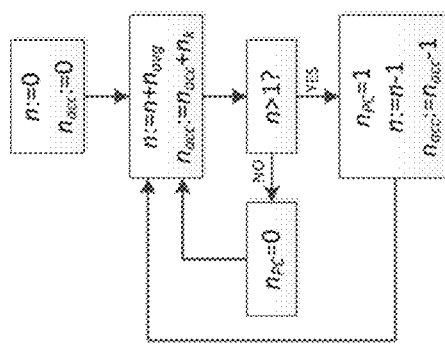

Starting from $n_{internal}$=0 and $n_{acc}$=0 and using a high order ΣΔ to provide $n_k$:

In FIG. 4A $n_{internal}$ is accumulated by $n_{avg}$ and compared to 1 as well as $n_{acc}$ being accumulated by $n_k$. If $n_{internal}$ is not >1, $n_{PC}$ is set to 0 and the next accumulations of n and $n_{acc}$ take place. If $n_{internal}$>1, $n_{PC}$ is set to 1 and both $n_{internal}$ and $n_{acc}$ are subtracted (compensated) by 1. This generates the sequence of values for $n_{PC}$ and $n_{acc}$ as per table 2 below:

TABLE 2

| $n_k$ (22) | $n_{internal}$ | $n_{PC}$ (26) | $n_{acc}$ (27) | N_div (17) | TDC_OUT (24) | TDC_SUM (29) |
|---|---|---|---|---|---|---|
| 0 | 0.3 | 0 | 0 | 100 | 0.3 | 0.3 |
| −3 | 0.6 | 0 | −3 | 100 | 0.6 | 3.6 |
| 1 | 0.9 | 0 | −2 | 100 | 0.9 | 2.9 |
| 3 | 0.2 | 1 | 0 | 101 | 0.2 | 0.2 |
| −1 | 0.5 | 0 | −1 | 100 | 0.5 | 1.5 |
| 4 | 0.8 | 0 | 3 | 100 | 0.8 | −2.2 |
| −3 | 0.1 | 1 | −1 | 101 | 0.1 | 1.1 |
| 1 | 0.4 | 0 | 0 | 100 | 0.4 | 0.4 |
| −3 | 0.7 | 0 | −3 | 100 | 0.7 | 3.7 |
| 4 | 1 | 0 | 1 | 100 | 1 | 0 |

As can be seen, TDC_OUT (24) spans only one DCO period requiring only low dynamic range of the TDC), and TDC_SUM (29) is the same as high dynamic range performance of Table 1, that is to say that the span of TDC_OUT is lower than that of TDC_SUM.

In FIG. 4B, $n_{internal}$ is accumulated by $n_{avg}$ and compared to 0.5 as well as $n_{acc}$ being accumulated by $n_k$. If $n_{internal}$ is not >0.5, $n_{PC}$ is set to 0 and the next accumulations of n and $n_{acc}$ take place. If $n_{internal}$>1, $n_{PC}$ is set to 1 and both n and $n_{acc}$ are subtracted (compensated) by 1. This generates the sequence of values for $n_{PC}$ and $n_{acc}$ as per table 3 below:

TABLE 3

| $n_k$ (22) | $n_{internal}$ | $n_{PC}$ (26) | $n_{acc}$ (27) | N_div (17) | TDC_OUT (24) | TDC_SUM (29) |
|---|---|---|---|---|---|---|
| 0 | 0.3 | 0 | 0 | 100 | 0.3 | 0.3 |
| −3 | −0.4 | 1 | −4 | 101 | −0.4 | 3.6 |
| 1 | −0.1 | 0 | −3 | 100 | −0.1 | 2.9 |
| 3 | 0.2 | 0 | 0 | 100 | 0.2 | 0.2 |
| −1 | 0.5 | 0 | −1 | 100 | 0.5 | 1.5 |
| 4 | −0.2 | 1 | 2 | 101 | −0.2 | −2.2 |
| −3 | 0.1 | 0 | −1 | 100 | 0.1 | 1.1 |
| 1 | 0.4 | 0 | 0 | 100 | 0.4 | 0.4 |

TABLE 3-continued

| $n_k$ (22) | $n_{internal}$ | $n_{PC}$ (26) | $n_{acc}$ (27) | N_div (17) | TDC_OUT (24) | TDC_SUM (29) |
|---|---|---|---|---|---|---|
| -3 | -0.3 | 1 | -4 | 101 | -0.3 | 3.7 |
| 4  | 0    | 0 | 0  | 100 | 0    | 0   |

As can be seen, TDC_OUT (24) spans only one DCO period (requiring only low dynamic range of the TDC), and TDC_SUM (29) is the same as high dynamic range performance of Table 1.

In FIG. 4C n is accumulated by $n_{avg}$ and compared to a constant c=2 as well as $n_{acc}$ being accumulated by $n_k$. If $n_{internal}$ is not >c, $n_{PC}$ is set to 0 and the next accumulations of $n_{internal}$ and $n_{acc}$ take place. If $n_{internal}$>c, $n_{PC}$ is set to c and both n and $n_{acc}$ are subtracted (compensated) by c. Constant c may be any suitable constant but should be lower than the span of $n_k$ for there to be a beneficial effect in relation to the dynamic range requirement of the TDC and hence current consumption.

This generates the sequence of values for $n_{PC}$ and $n_{acc}$ as per table 4 below:

TABLE 4

| $n_k$ (22) | $n_{internal}$ | $n_{PC}$ (26) | $n_{acc}$ (27) | N_div (17) | TDC_OUT (24) | TDC_SUM (29) |
|---|---|---|---|---|---|---|
| 0  | 0.3 | 0 | 0  | 100 | 0.3 | 0.3  |
| -3 | 0.6 | 0 | -3 | 100 | 0.6 | 3.6  |
| 1  | 0.9 | 0 | -2 | 100 | 0.9 | 2.9  |
| 3  | 1.2 | 0 | 1  | 100 | 1.2 | 0.2  |
| -1 | 1.5 | 0 | 0  | 100 | 1.5 | 1.5  |
| 4  | 1.8 | 0 | 4  | 100 | 1.8 | -2.2 |
| -3 | 0.1 | 2 | -1 | 102 | 0.1 | 1.1  |
| 1  | 0.4 | 0 | 0  | 100 | 0.4 | 0.4  |
| -3 | 0.7 | 0 | -3 | 100 | 0.7 | 3.7  |
| 4  | 1   | 0 | 1  | 100 | 1   | 0    |

As can be seen, TDC_OUT (24) spans two DCO periods (requiring only low dynamic range of the TDC), and TDC_SUM (29) is the same as high dynamic range performance of Table 1, that is to say that the span of TDC_OUT is lower than that of TDC_SUM.

In FIG. 4D, $n_{internal}$ is accumulated by a sequence $n_{SD1}$ with average value $n_{avg}$ and compared to 1 as well as $n_{acc}$ being accumulated by $n_k$. The sequence $n_{SD1}$ could possibly but not necessarily be created by a first order $\Sigma\Delta$. If $n_{internal}$ is not >=1, $n_{PC}$ is set to 0 and the next accumulations of n and $n_{acc}$ take place. If $n_{internal}$>=1, $n_{PC}$ is set to 1 and both $n_{internal}$ and $n_{acc}$ are subtracted (compensated) by 1. This generates the sequence of values for $n_{PC}$ and $n_{acc}$ as per table 5 below:

TABLE 5

| $n_k$ (22) | $n_{SD1}$ | $n_{internal}$ | $n_{PC}$ (26) | $n_{acc}$ (27) | N_div (17) | TDC_OUT (24) | TDC_SUM (29) |
|---|---|---|---|---|---|---|---|
| 0  | 0 | 0 | 0 | 0  | 100 | 0.3  | 0.3  |
| -3 | 1 | 0 | 1 | -4 | 101 | -0.4 | 3.6  |
| 1  | 0 | 0 | 0 | -3 | 100 | -0.1 | 2.9  |
| 3  | 0 | 0 | 0 | 0  | 100 | 0.2  | 0.2  |
| -1 | 1 | 0 | 1 | -2 | 101 | -0.5 | 1.5  |
| 4  | 0 | 0 | 0 | 2  | 100 | -0.2 | -2.2 |
| -3 | 1 | 0 | 1 | -2 | 101 | -0.9 | 1.1  |
| 1  | 0 | 0 | 0 | -1 | 100 | -0.6 | 0.4  |
| -3 | 0 | 0 | 0 | -4 | 100 | -0.3 | 3.7  |
| 4  | 0 | 0 | 0 | 0  | 100 | 1    | 0    |

In all four flowchart examples above, the final value for TDC_SUM are identical (hence boosting the output of TDC_OUT to that of a TDC without a reduced dynamic range (that is to say that the span of TDC_OUT is lower than that of TDC_SUM). As shown, there are many suitable implementations of how the phase compensator 25 can provide an input to the divider module and a feed forward boost to reduce dynamic range requirement of TDC 13 while maintaining noise performance of the PL as a whole.

Figure 5:
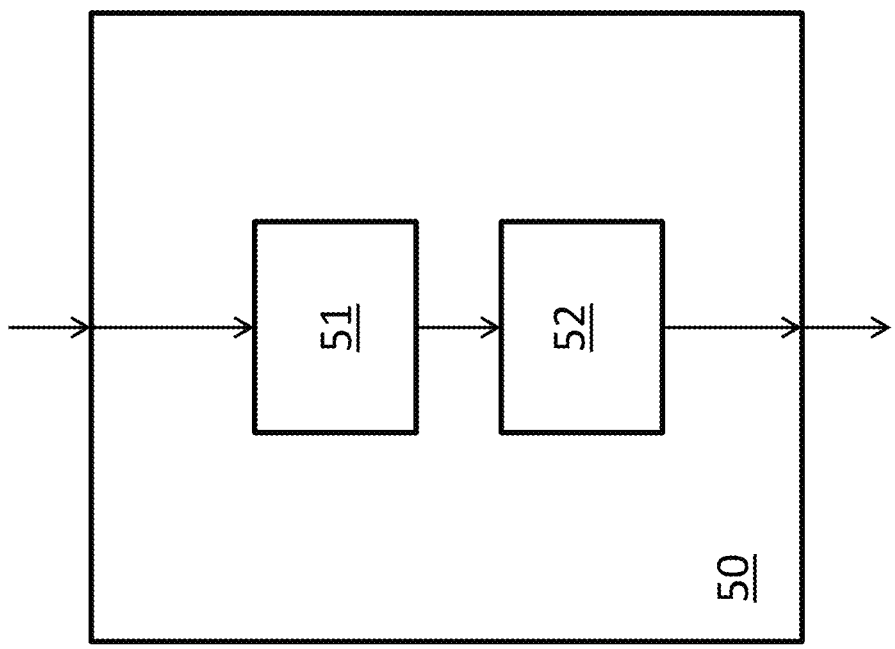
FIG. 5 illustrates a method of configuring a PLL.

As shown in FIG. 5, there is provided a method 50 of configuring a PLL 30. A phase compensator 25 is used to reduce the dynamic range of a TDC 13 of the PLL while maintaining PLL performance, such as noise performance.

Method 50 may comprise a sub step 51 of configuring the PLL 30 by using the phase compensator 25 to configure a configurable divider module 166 of the feedback loop 18.

Method 50 may comprise a sub step 52 of using the phase compensator 25 to boost an output, TDC_OUT of the TDC 13 to that of a TDC without a reduced dynamic range such that sigma delta noise shaping of the PLL is maintained.

The method 50 may comprise providing on a first output of the phase compensator to the divider module, a low sigma delta signal converted from a high sigma-delta signal input to the phase compensator, and providing on a second output of the phase compensator, a feedforward signal to be added to the output of the TDC to boost the output of the TDC to levels typical of a high sigma delta input to the divider module.

The various methods described above may be implemented by a computer program. The computer program may include computer code arranged to instruct a computer or processor to perform the functions of one or more of the various methods described above. The computer program and/or the code for performing such methods may be provided to an apparatus, such as a computer or processor, on one or more computer readable media or, more generally, a computer program product. The computer readable media may be transitory or non-transitory. The one or more computer readable media could be, for example, an electronic, magnetic, optical, electromagnetic, infrared, or semiconductor system, or a propagation medium for data transmission, for example for downloading the code over the Internet. Alternatively, the one or more computer readable media could take the form of one or more physical computer readable media such as semiconductor or solid state memory, magnetic tape, a removable computer diskette, a random access memory (RAM), a read-only memory (ROM), a rigid magnetic disc, and an optical disk, such as a CD-ROM, CD-R/W or DVD.

In an implementation, the modules, components and other features described herein can be implemented as discrete components or integrated in the functionality of hardware components such as ASICS, FPGAs, DSPs or similar devices.

The following shows the real world benefit of the phase compensator 25.

Taking a typical TDC 13 with relevant parameters as per table 6 below:

TABLE 6

| Process | 40 nm CMOS |
|---|---|
| TDC Architecture | Vernier delay cells and DFF's |
| Supply voltage | 1.2 V |
| $\Delta t_{RES}$ | 12 ps |
| No. of steps | 32 |
| Power consumption | 3 mW (normal operation) |
| $f_{DCO}$ | 4.25 GHz |
| $f_{REF}$ | 33.868 MHz |
| Phase Noise (in-band) | <−95 dBc |

As seen in Table 6, the TDC consumes 3 mW. It has a traditional 32 steps Vernier-delay architecture in a 40 nm CMOS process. Normalising these numbers to the example of equation (1) earlier, with $\Delta t_{res}$=9 ps, $f_{REF}$=26 MHz and a high-order $\Sigma\Delta$ (between −3 and +4), a very rough estimation of the power consumption ($P_{TDC1}$) would be:

$$P_{TDC1} = 3 \text{ mW} * \frac{37*9 \text{ steps}}{32 \text{ steps}} * \frac{26 \text{ MHz}}{33.868 \text{ MHz}} = 24 \text{ mW} \quad (4)$$

Figure 1:
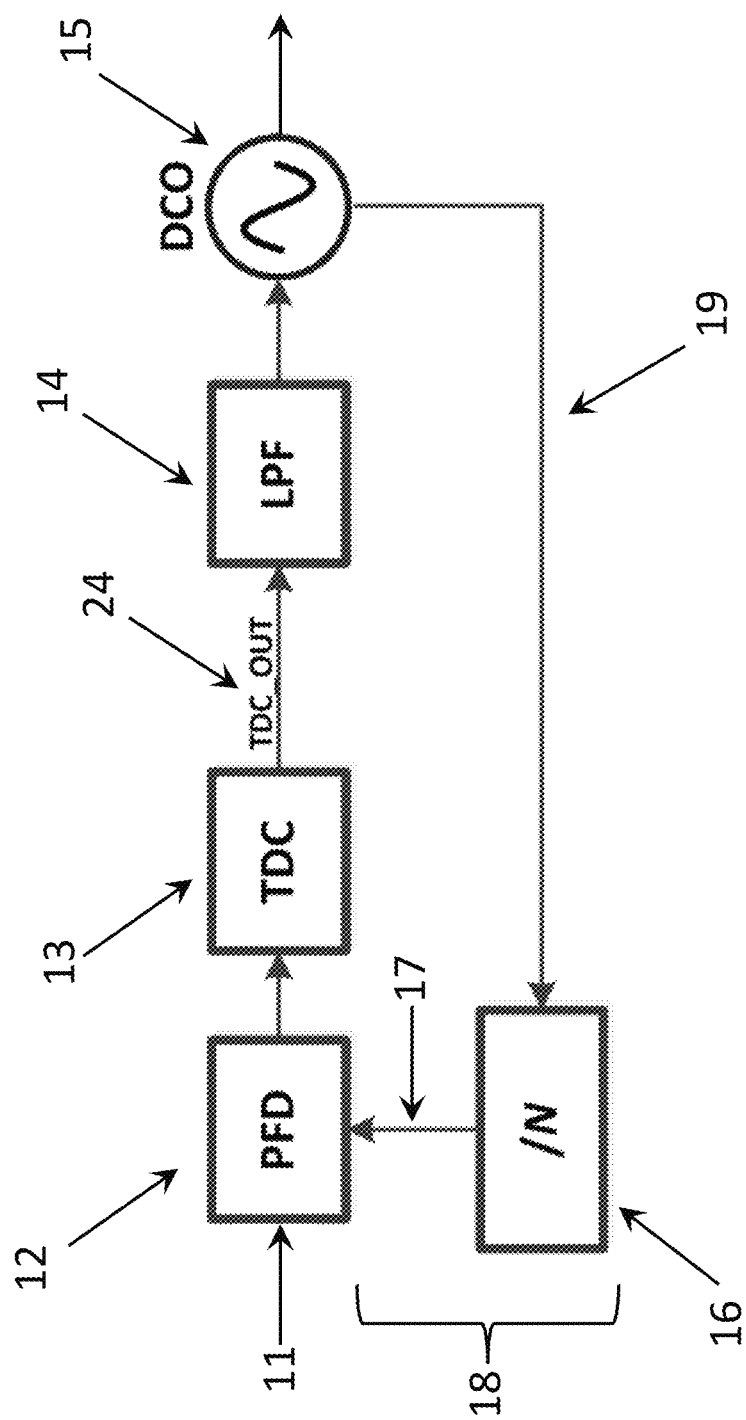
FIG. 1 illustrates an integer N PLL architecture.

To explain the steps normalisation:

The example of table six uses 32 steps, however the example of FIG. 1 requires 37×9 steps as explained by:

37 is the number of steps per DCO period: $T_{DCO}/\Delta t_{res}$=1/(3 GHz*9 ps).

9 is the number of DCO periods:

(−3 to +4) plus 1 for normal loop dynamics=9.

To explain the frequency normalisation:

TDC 13 operates once every clock period of reference signal 11. A higher frequency means it operates more often. Hence the power is multiplied by the factor 26 MHz/33.868 MHz.

The calculated power $P_{TDC1}$=24 mW is much higher than typical DCO power, which usually around 10 mW.

When utilising the phase compensator 25 to configure the PLL, the TDC power ($P_{TDC2}$) will be reduced to 2/9 of that of equation (4), since only 2 out of 9 DCO periods will be needed for phase detection. 9 periods are needed for the high order of the example without using a phase compensator 25, and two periods are needed for the actual TDC_OUT signal of tables 2 to 5 when a phase compensator is used.

$$P_{TDC2}=P_{TDC1}*2/9=5.3 \text{ mW} \quad (5)$$

To conclude, Equations (4) and (5) indicate that the power consumption for high-order $\Sigma\Delta$ in a TDC-based ADPLL or digital intensive PLL 30 can be reduced considerably while maintaining noise performance.

The proposed phase compensator 25 reduces the dynamic range of the TDC 13, which can be used to trade off current consumption, phase noise, design complexity and chip area (real-estate). Also, it allows one to use arbitrarily high order $\Sigma\Delta$ for fractional noise suppression.

As a result, the PLL 30 will have:

Better phase noise

Lower current consumption

Lower design complexity.

Smaller layout area

The invention claimed is:

1. A phase locked loop (PLL) comprising a time to digital converter (TDC) and a fractional-n feedback loop, the PLL being configurable by a configurable divider module, which is configurable by a phase compensator module to reduce the dynamic range of the TDC required to maintain PLL performance.

2. A phase locked loop (PLL) comprising a time to digital converter (TDC) and a fractional-n feedback loop, the PLL being configurable by a phase compensator module to reduce the dynamic range of the TDC required to maintain PLL performance wherein the phase compensator module comprises an input coupled to an output of a sigma delta module for noise shaping.

3. The PLL of claim 1 wherein the phase compensator module further comprises an output to be added to an output of the TDC.

4. The PLL of claim 3 wherein the output of the phase compensator module is arranged to boost the output of the TDC to that of a TDC without a reduced dynamic range such that sigma delta noise shaping of the PLL is maintained.

5. The PLL of claim 1 wherein the phase compensator module is arranged to provide on a first output to the divider module, a low sigma delta signal converted from a high sigma-delta signal input to the phase compensator module, and to provide on a second output, a feedforward signal to boost the output of the TDC to levels typical of a high sigma delta input to the divider module.

6. A phase locked loop (PLL) comprising a time to digital converter (TDC) and a fractional-n feedback loop, the PLL being configurable by a phase compensator module to reduce the dynamic range of the TDC required to maintain PLL performance wherein an output of the phase compensation module to be added to an output of the TDC is amplified by the phase compensation module or by a gain module.

7. The PLL of claim 2 wherein the sigma delta module is arranged to provide high order sigma delta modulation at its output.

8. A phase locked loop (PLL) comprising a time to digital converter (TDC) and a fractional-n feedback loop, the PLL being configurable by a phase compensator module to reduce the dynamic range of the TDC required to maintain PLL performance wherein the PLL further comprises a phase frequency detector, "PFD", a loop filter, "LPF" and digital controlled oscillator, "DCO".

9. A phase locked loop (PLL) comprising a time to digital converter (TDC) and a fractional-n feedback loop, the PLL being configurable by a phase compensator module to reduce the dynamic range of the TDC required to maintain PLL performance wherein the PLL comprises an all-digital PLL or a digital intensive PLL.

10. A method of configuring a PLL according to claim 1, the method comprising using a phase compensator module to reduce the dynamic range of a TDC of the PLL while maintaining PLL performance.

11. The method of claim 10 further comprising the configuring the PLL by configuring a configurable divider module of the feedback loop with the phase compensator module.

12. The method of claim 10 further comprising the phase compensator module boosting an output of the TDC to that of a TDC without a reduced dynamic range such that sigma delta noise shaping of the PLL is maintained.

13. The method of claim 10 comprising providing on a first output of the phase compensator module to the divider module, a low sigma delta signal converted from a high sigma-delta signal input to the phase compensator module, and providing on a second output of the phase compensator module, a feedforward signal to be added to the output of the TDC to boost the output of the TDC to levels typical of a high sigma delta input to the divider module.

14. A non-transitory machine readable medium comprising instructions that when executed by a processor cause the processor to carry out the method of claim 10.

15. A method of configuring a PLL according to claim 2, the method comprising using a phase compensator module to reduce the dynamic range of a TDC of the PLL while maintaining PLL performance and coupling an input of the phase compensation module to an output of a sigma delta module for noise shaping.

16. A method of configuring a PLL according to claim 7, the method comprising using a phase compensator module to reduce the dynamic range of a TDC of the PLL while maintaining PLL performance and amplifying, by the phase compensation module or a gain module, an output of the phase compensation module to be added to an output of the TDC.

17. A method of configuring a PLL according to claim 8, the method comprising using a phase compensator module to reduce the dynamic range of a TDC of the PLL while maintaining PLL performance wherein the PLL further comprises a phase frequency detector, "PFD", a loop filter, "LPF" and digital controlled oscillator, "DCO".

18. A method of configuring a PLL according to claim 9, the method comprising using a phase compensator module to reduce the dynamic range of a TDC of the PLL while maintaining PLL performance wherein the PLL comprises an all-digital PLL or a digital intensive PLL.

19. A non-transitory machine readable medium comprising instructions that when executed by a processor cause the processor to carry out the method of claim 15.

20. A non-transitory machine readable medium comprising instructions that when executed by a processor cause the processor to carry out the method of claim 16.

21. A non-transitory machine readable medium comprising instructions that when executed by a processor cause the processor to carry out the method of claim 17.

22. A non-transitory machine readable medium comprising instructions that when executed by a processor cause the processor to carry out the method of claim 18.

* * * * *